(12) United States Patent
Oesingmann

(10) Patent No.: US 6,828,787 B2
(45) Date of Patent: Dec. 7, 2004

(54) METHOD FOR MAGNETIC RESONANCE IMAGING WITH AUTOMATIC ADAPTATION OF THE MEASURING FIELD

(75) Inventor: Niels Oesingmann, Herzogenaurach (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/352,578

(22) Filed: Jan. 28, 2003

(65) Prior Publication Data

US 2003/0173965 A1 Sep. 18, 2003

(30) Foreign Application Priority Data

Jan. 28, 2002 (DE) .......................................... 102 03 237

(51) Int. Cl.[7] .................................................. G01V 3/00
(52) U.S. Cl. ...................................................... 324/307
(58) Field of Search ................................. 324/307, 309, 324/300; 600/410

(56) References Cited

U.S. PATENT DOCUMENTS

| | | | | |
|---|---|---|---|---|
| 4,830,012 A | * | 5/1989 | Riederer ..................... | 600/410 |
| 5,345,172 A | * | 9/1994 | Taguchi et al. ............. | 324/309 |
| 5,374,889 A | * | 12/1994 | Leach et al. ................ | 324/309 |
| 5,694,935 A | * | 12/1997 | Damadian ................... | 600/415 |
| 5,879,299 A | * | 3/1999 | Posse et al. ................. | 600/410 |
| 5,903,149 A | * | 5/1999 | Gonen et al. ................ | 324/307 |
| 6,023,636 A | * | 2/2000 | Wendt et al. ................ | 600/410 |
| 6,326,786 B1 | * | 12/2001 | Pruessmann et al. ....... | 324/312 |
| 6,400,157 B1 | * | 6/2002 | Bonanni et al. ............. | 324/322 |
| 6,408,201 B1 | | 6/2002 | Foo et al. | |
| 6,476,607 B1 | * | 11/2002 | Dannels et al. ............. | 324/309 |
| 6,552,540 B2 | * | 4/2003 | Fuderer ....................... | 324/309 |
| 6,583,623 B1 | * | 6/2003 | Kwok et al. ................ | 324/307 |
| 6,606,514 B2 | * | 8/2003 | Grass et al. ................. | 600/427 |

* cited by examiner

Primary Examiner—Diego Gutierrez
Assistant Examiner—Dixomara Vargas
(74) Attorney, Agent, or Firm—Schiff Hardin LLP

(57) ABSTRACT

In a method for magnetic resonance imaging, with which an imaging magnetic resonance measurement of a region of interest in an object under examination is carried out, and a tomogram of the region is displayed, that can be prescribed in position and orientation, and a two- or three-dimensional magnetic resonance overview image of at least a part of the object under examination is made before the imaging magnetic resonance measurement. In the method an envelope of the part of the object under examination is determined automatically from the magnetic resonance overview picture, and the dimensions of a minimal measuring field for the imaging magnetic resonance measurement are automatically calculated from the position and orientation of the prescribable slice, taking account of the envelope, for which no folds, or a prescribable measure thereof, occur in the tomogram. Optimal adaptation of the minimal measuring field to the respectively selected slice in a simple manner.

9 Claims, 3 Drawing Sheets

METHOD FOR MAGNETIC RESONANCE IMAGING WITH AUTOMATIC ADAPTATION OF THE MEASURING FIELD

BACKGROUND OF THE INVENTION

1. Field of the Invention

The present invention relates to a method for magnetic resonance imaging, with which an imaging magnetic resonance measurement of a region of interest in an object under examination is carried out, wherein a magnetic resonance tomogram of the region is displayed that can be prescribed in position and orientation, and wherein a two- or three-dimensional magnetic resonance overview image of at least a part of the object under examination is produced before the imaging magnetic resonance measurement.

2. Description of the Prior Art

Magnetic resonance tomography is a known technique for obtaining images of the interior of the body of a living object under examination. In order to carry out magnetic resonance tomography, a basic field magnet generates a static, relatively homogenous basic magnetic field. It may be assumed that the basic magnetic field prescribes a direction z in space and thus defines a right-handed orthogonal coordinate system. During the recording of magnetic resonance images of prescribable slices rapidly switched gradient fields, that are generated by gradient coils, are superposed on this basic magnetic field. The spatial coding of the magnetic resonance signals that is required for the spatial resolution can be achieved by suitable selection of the gradient fields. A distinction is generally made between the slice direction, the readout direction and the phase coding direction, which are perpendicular to one another. High-frequency (radio-frequency) pulses for triggering magnetic resonance signals are radiated into the object under examination with high-frequency transmitting antennas during an imaging magnetic resonance sequence. The magnetic resonance signals triggered by these high-frequency pulses are picked up by high-frequency receiving antennas. The magnetic resonance images of one or more slices of the body region of interest, that can be prescribed in position and orientation, are produced on the basis of these magnetic resonance signals received with receiving antennas.

This reconstruction of the magnetic resonance images presupposes a unique spatial coding of the measured data. The size of the imaging or measuring field (FoV: Field of View) for detecting the region of interest must be prescribed for the spatial coding. If the receiving antenna covers the volume excited with the HF pulses, it is necessary to adapt this measuring field to the size of the object. If this adaptation is not undertaken, ambiguous signal codings occur that lead to folds in the reconstructed magnetic resonance images (aliasing artifacts, wrap-around artifacts).

Time-consuming additional measurements of data rows are frequently necessary to avoid folds in the phase coding direction. As a rule, the slice-selective excitations are used in the slice direction, while double the sampling rate is constantly used for measurement in many cases in the readout direction in order to avoid the folds, since there is no need to accept any temporal restrictions. However, it is desirable despite these measures to have the best possible adaptation of the measuring field to the region of interest, since an improvement in the spatial resolution is associated with a smaller measuring field. However, when a section is conducted obliquely, in the case of magnetic resonance imaging of slices whose normal direction does not coincide with an orthogonal spatial direction of the basic field or of a main body axis, it is difficult to estimate the required minimal size of the measuring field for which no folds, or only a prescribable level thereof, occur in the magnetic resonance image. Furthermore, in such cases, it is frequently impossible to estimate the relatively small measuring field available owing to the over-sampling. Consequently, for safety reasons, measurements are sometimes made with excessively large measuring or imaging fields, in order to avoid folds. However, an excessively large measuring or imaging field leads again to loss of resolution.

The prescription of the dimensions of the measuring field is currently performed by the user of the magnetic resonance installation by manually varying the image size and image position by means of a graphical slice positioning in a magnetic resonance overview image of the body region, or by entering the appropriate position parameters. Furthermore, the phase coding and readout directions can be interchanged manually in order to optimize the measuring field and to minimize the folds. The phase coding direction is selected in this case to be in the direction of the shortest axis of the two-dimensional measuring field. Occasionally, individual antenna or coil elements are also switched off, or additional saturation pulses are switched within the excitation pulse sequence in order to reduce the signal contribution of the folds in the magnetic resonance image. All of these measures are entered manually by the user of the installation and require a considerable degree of experience.

SUMMARY OF THE INVENTION

It is an object of the present invention to provide a method for magnetic resonance imaging that simplifies the selection of the optimal measuring field for the user of a magnetic resonance installation.

The object is achieved in accordance with the invention in a method for magnetic resonance imaging, an imaging magnetic resonance measurement of a region of interest in an object under examination is carried out in a known way, and a magnetic resonance tomogram of the region is displayed, that can be prescribed in position and orientation by a user wherein, before the imaging magnetic resonance measurement, a two- or three-dimensional magnetic resonance overview image of the object under examination, or a part of the object under examination, for example the thorax, is made, and can be used to localize, position and orientate slices for the subsequent magnetic resonance pictures. In accordance with the present invention, the envelope of the object under examination or of the part of the object under examination on which the overview image is based, is automatically calculated (i.e., calculated by computer without human intervention) from this magnetic resonance overview image. This envelope corresponds to the outer boundaries of the object. After the user has prescribed the position and orientation of the slice of the object under examination from which signals are to be obtained for the planned magnetic resonance picture, a cutting surface with the envelopes of the object under examination being formed from this position and orientation of the slice plane or cutting plane, and the dimension of the minimal measuring field for the planned imaging magnetic resonance measurement being calculated therefrom. This can be performed in conjunction with the stipulation that no folds occur in the magnetic resonance image subsequently to be obtained, or in conjunction with the stipulation that a degree or level (severity) of folds that is prescribed by the user, for example only in a narrow edge region of the magnetic resonance image. The determination of the minimal measuring field is performed in the inventive method in a fully automatic fashion without the need for the user to introduce any estimates or empirical values.

The present invention thus substantially simplifies the determination of the optimal measuring field during the magnetic resonance measurement, and so the minimal possible measuring field with the maximum resolution is used at any time. Far fewer estimates and settings by the user are required when planning the measurement owing to the automatic calculation of the cutting planes with the object, which are produced upon a change in the slice orientation for subsequent further magnetic resonance measurements. Use is made of the fact that the dimensions of any desired cutting surface with the object can be calculated automatically by means of the foregoing three-dimensional magnetic resonance overview image. This technique offers substantial advantages particularly when conducting a section with a double inclination.

In an embodiment of the inventive method, the phase coding and readout directions are additionally selected automatically as a function of the calculated dimensions of the measuring field such that the readout direction corresponds to the direction of the longer axis of the measuring field. The phase coding and readout directions are therefore always selected optimally with regard to the measurement period. Again, over-sampling desired by the user or provided in the measurement protocol can automatically be taken into account in the present invention in order to determine the minimal size of the measuring field without folds or with a prescribable level of folds.

In a further embodiment of the invention, the sensitivity volume of the coil elements of the receiving antenna also can be taken into account when calculating the minimal measuring field. This sensitivity volume is already known, as a rule, and can be integrated in the process of calculation. Of course, the sensitivity volume also can be determined in a known way when taking the three-dimensional overview picture, as is also done, for example, to optimize the shimming. The minimal measuring field must completely surround the sensitivity volume in the cutting plane in order to avoid folds completely.

In the simplest version of the present method, for the purpose of completely avoiding folds, the minimal measuring field is set around the calculated cutting surface with the object under examination in such a way that this cutting surface is precisely completely surrounded by the measuring field. A relatively small measuring field produces folds whose measure can likewise be calculated, depending on the dimension of the measuring field in the phase coding or readout directions, in relation to the extent, bounded by the envelope of the object, of the cutting surface.

The automatic adaptation of the measuring field is a protocol property that the user can select in the menu or in the protocol controller. It is performed by the user during the graphical slice positioning, during the positioning and rotation or orientation of the desired cutting planes on the display screen in the overview image, and without permanently making enquiries of the user. If changes to other sequence parameters of the measuring sequence are required or possible, these changes are made after the slice positioning. Of course, the user is also given the possibility of once again changing the automatically calculated minimal measuring field before carrying out the magnetic resonance measurement.

DESCRIPTION OF THE PREFERRED EMBODIMENTS

Figure 1:
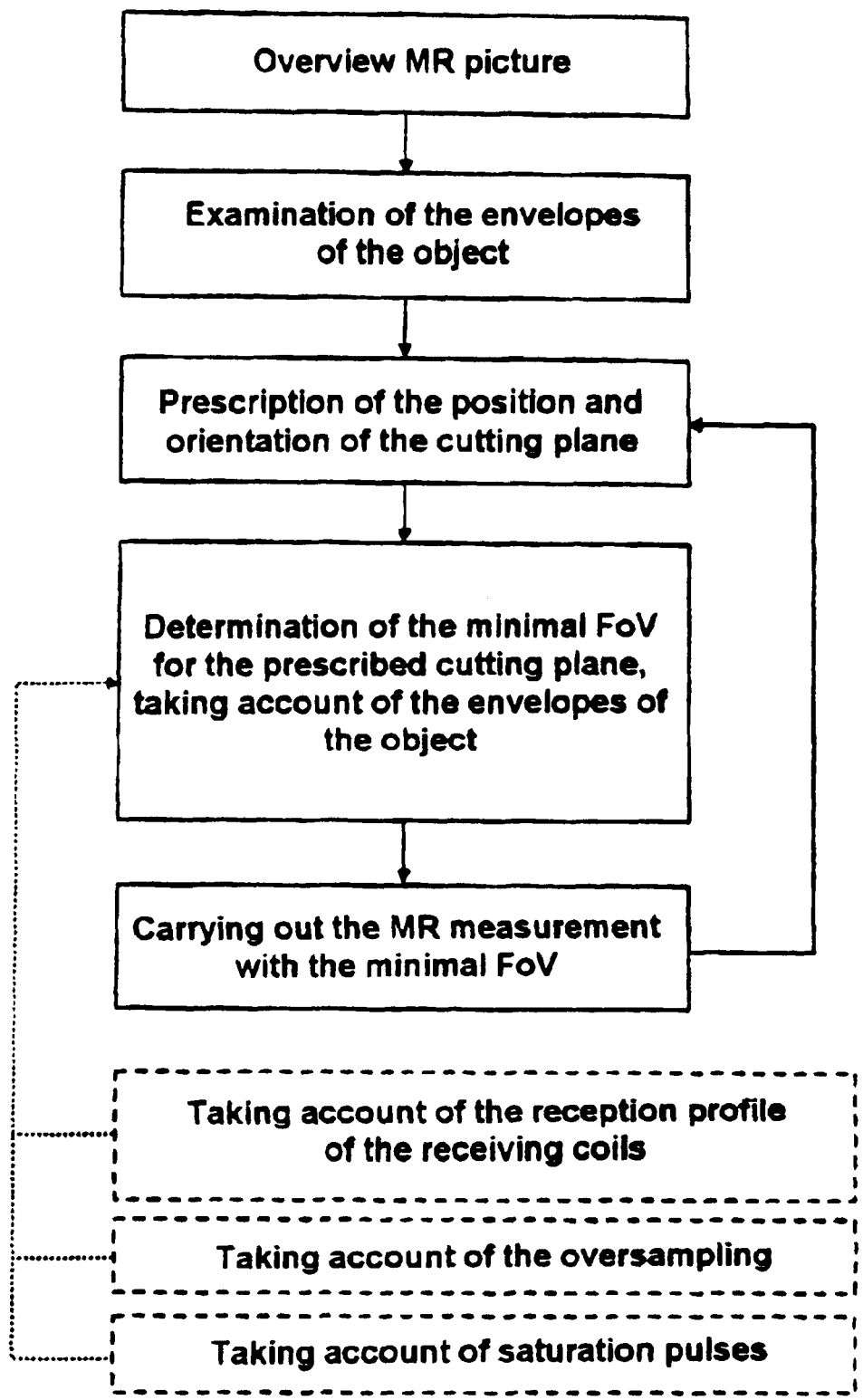
FIG. 1 schematically illustrates the sequence of the present method of magnetic resonance imaging with determination of the optimal measuring field in a flowchart.

FIG. 1 shows the individual steps for implementing the present imaging magnetic resonance measurement. As in the case of virtually all magnetic resonance examinations, the starting point of this measurement is an overview image of the object under examination or a part of the object under examination for the purpose of further localization and positioning of the subsequent images, i.e., the cutting planes with the object under examination, from which a magnetic resonance tomogram is to be obtained.

Figure 2:
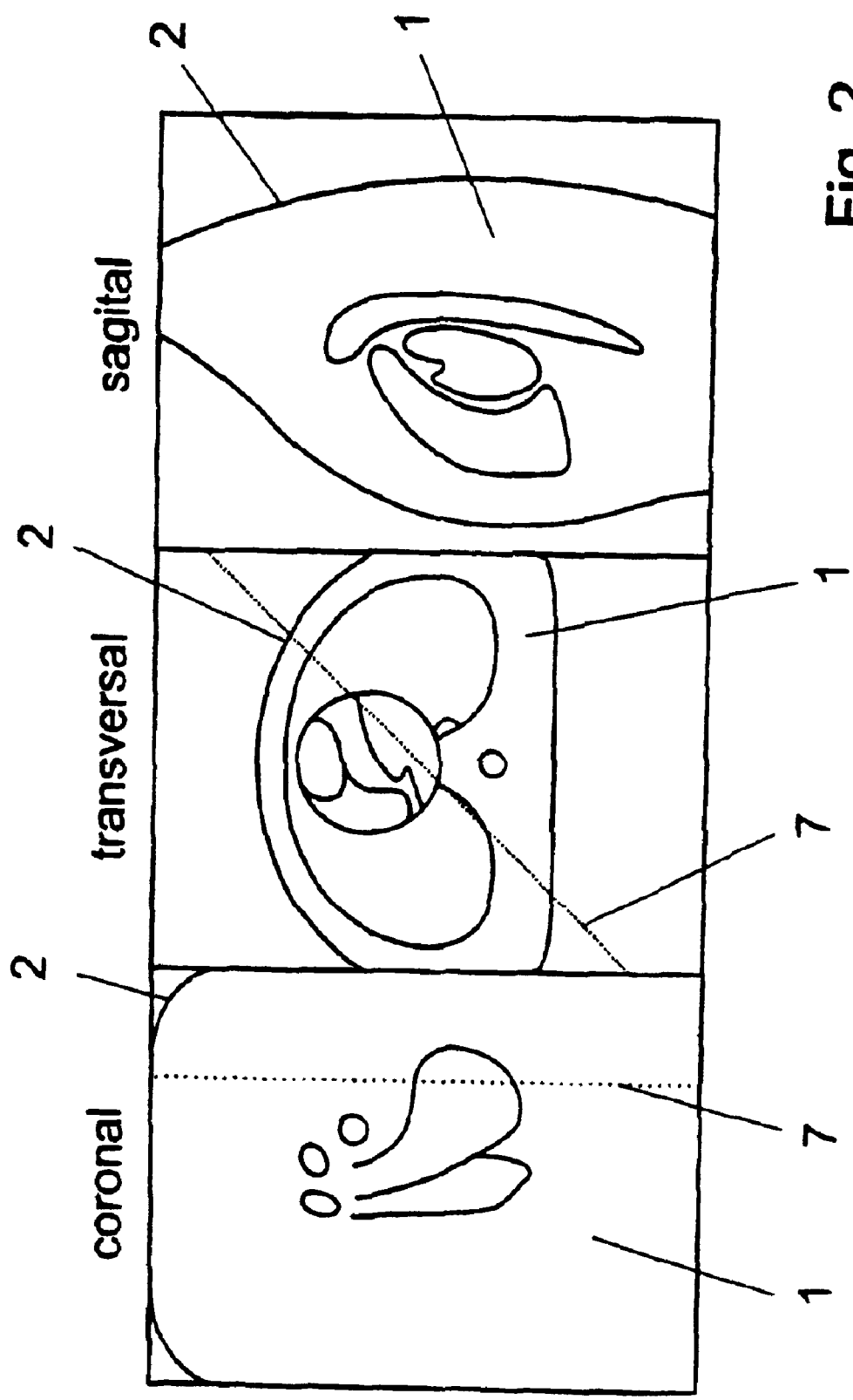
FIG. 2 shows examples of three tomograms, obtained from an overview image, for positioning and orienting the slice to be measured in accordance with the principles of the invention.

FIG. 2 shows an example of such localization and positioning, in which a coronal, a transversal and a sagittal view are selected from the magnetic resonance overview image. The three views show a part of the object 1 under examination in the corresponding views from which the envelope 2 of the object 1 under examination can be seen. The three-dimensional envelope 2 of the object 1 under examination is automatically calculated in the method from the measured overview data such that the extent of the object 1 in arbitrary cutting planes with the object is known. The user marks in these views the position and orientation of the slice, that is to be detected, for the subsequent imaging magnetic resonance measurement, as indicated by the dashed lines 7.

In this application of the graphical slice positioning (GSP), the user now selects the option of automatic adaptation of geometric parameters. For example, if the user is planning to conduct a tilted section parasagittally, the minimal measuring field is calculated automatically after the stipulation of the position and orientation of the cutting plane to be detected and in accordance with the envelope of the object, or the object boundaries, and can be visualized in the view. This calculation is not time-consuming since all that is required is the geometric calculation of the cutting surface of the selected cutting plane with the envelope of the object. If the cutting surface bounded by the envelope is known, the minimal measuring field can be laid around this cutting surface (compare FIG. 3). The subsequent magnetic resonance measurement for recording a magnetic resonance image of the selected slice is then carried out with this automatically calculated measuring field. If the dimension of the cutting surface with the object is smaller in the prior readout direction than in the phase coding direction, the two directions are interchanged automatically before carrying out the measurement. The over-sampling in the readout direction, the sensitivity profile of the coils, or else the position and extent of saturation pulses are taken into account automatically.

In addition to the option of a magnetic resonance image without folds, it is also possible to prescribe a specific level of folds that is acceptable to the user. The minimal measuring field is then likewise calculated automatically on the basis of these stipulations. The geometric parameters are handled either as basic settings or as proposals from the system that, however, the user can still always influence and change. No other automatic adaptation is performed by the user in the case of a change if the position and orientation of the cutting plane do not change.

Figure 3:
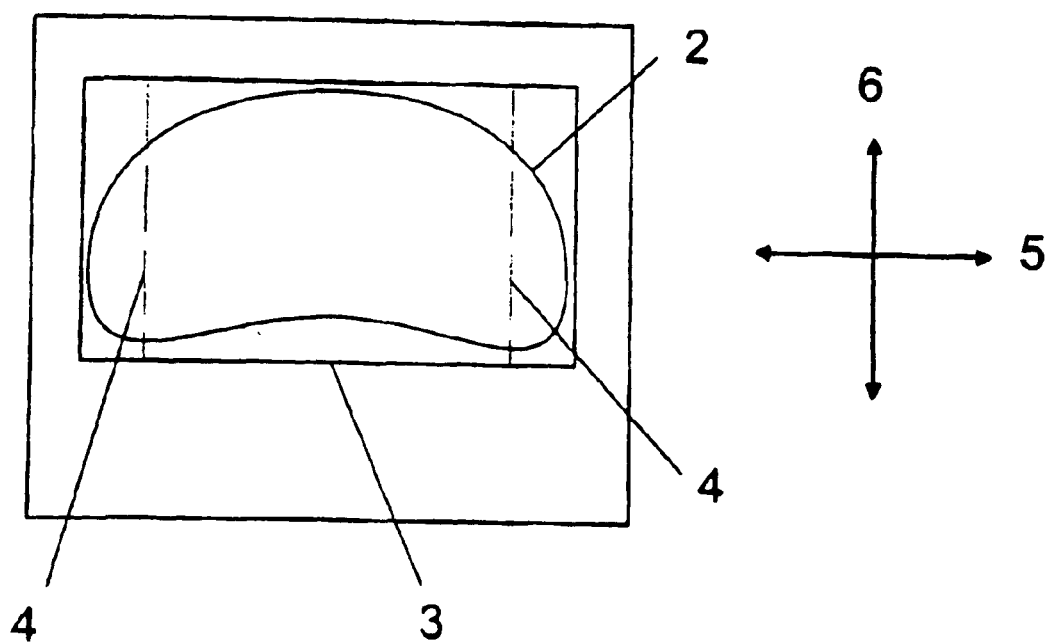
FIG. 3 schematically illustrates the dimension of the minimal measuring field relative to the envelopes of the object in accordance with the invention.

FIG. 3 shows a highly schematic example of a tomogram of the region of interest in the object 1 under examination. The minimal measuring field 3 is selected in this example in order to avoid folds such that it precisely completely surrounds the envelope 2 of the object under examination. Furthermore, the phase coding direction 6 and the readout direction 5 are selected such that the phase coding direction 5 runs in the direction of the shorter axis of the calculated measuring field 3.

If the user specifies a specific level of folds that the user is prepared to accept in the magnetic resonance image, it is also possible, for example, for the measuring field 3 to cut the envelope 2, as is indicated by the dashed lines 4. In the case of such a reduced measuring field, folds occur in the magnetic resonance image in the readout direction 5 on both sides, their level being a function of the dimensions of the measuring field relative to the extent of the object in the readout direction, and can be calculated.

The measuring field is automatically optimized in the case of the present method for each change in position or orientation of the cutting plane or measuring slice, and the optimal direction of phase coding is selected. In this way, a measuring field is always measured with maximal spatial resolution under the given conditions and with minimal folds or folds that the user can prescribe.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for magnetic resonance imaging comprising the steps of:

prior to conducting a magnetic resonance measurement of a region of interest of an examination subject, obtaining a multi-dimensional overview image of at least said region of interest, and displaying said overview image;

in the displayed overview image, designating a position and an orientation of a slice of said region of interest for which said magnetic resonance measurement is to be subsequently conducted to obtain a magnetic resonance image of said slice;

manually entering into a computer an input designating a degree of folds to be permitted in said image of said slice, said input being selected from the group consisting of no folds and a prescribed level of folds; and in said computer, automatically calculating an envelope of said region of interest from said overview image and automatically calculating dimensions of a minimal field of view for said magnetic resonance measurement from said envelope and said position and orientation of said slice, dependent on said input.

2. A method as claimed in claim 1 wherein the step of obtaining a multi-dimensional overview image comprises obtaining a two-dimensional overview image.

3. A method as claimed in claim 1 wherein the step of obtaining a multi-dimensional overview image comprises obtaining a three-dimensional overview image.

4. A method as claimed in claim 1 comprising the additional step of conducting said magnetic resonance measurement with said minimal field of view to obtain said image of said slice with said permitted degree of folds.

5. A method as claimed in claim 1 comprising making an indication of said dimensions of said minimal field of view available to an operator prior to conducting said magnetic resonance measurement, and allowing said operator to alter said dimensions for conducting said magnetic resonance measurement.

6. A method as claimed in claim 1 wherein said magnetic resonance measurement has a readout direction and a phase-coding direction associated therewith, and wherein said dimensions include a longer access of said field of view, and comprising the additional step of automatically selecting, in said computer, said readout direction and said phase-coding direction for said magnetic resonance measurement with said readout direction corresponding to a direction of said longer access.

7. A method as claimed in claim 1 comprising the additional step of entering an additional input into said computer designating a prescribed over-sampling for said magnetic resonance measurement, and wherein the step of automatically calculating dimensions of said minimal field of view comprises automatically calculating dimensions of said minimal field of view for said magnetic resonance measurement from said envelope and said position and orientation of said slice, dependent on said input and said additional input.

8. A method claimed in claim 1 wherein said magnetic resonance measurement is to be conducted employing reception coils having respective sensitivity profiles, and wherein the step of automatically calculating dimensions of said minimal field of view comprises automatically calculating dimensions of said minimal field of view for said magnetic resonance measurement from said envelope and said position and orientation of said slice, dependent on said input and said sensitivity profiles.

9. A method as claimed in claim 1 wherein said magnetic resonance measurement is to include saturation pulses respectively having a position and extent, and wherein the step of automatically calculating dimensions of said minimal field of view comprises automatically calculating dimensions of said minimal field of view for said magnetic resonance measurement from said envelope and said position and orientation of said slice, dependent on said input and the respective positions and extents of said saturation pulses.

* * * * *